United States Patent [19]

Zaks

[11] Patent Number: 5,140,701
[45] Date of Patent: Aug. 18, 1992

[54] CARRIER SIGNAL DETECTION CIRCUIT FEATURING A WIDE RANGE OF SIGNAL/NOISE PERFORMANCE

[75] Inventor: Chaim Zaks, Germantown, Md.
[73] Assignee: Comsat, Washington, D.C.
[21] Appl. No.: 684,086
[22] Filed: Apr. 12, 1991
[51] Int. Cl.$^5$ .............................................. H04B 1/16
[52] U.S. Cl. ................................. 455/164.1; 455/260; 455/307
[58] Field of Search ............... 455/307, 339, 340, 260, 455/164

[56] References Cited

U.S. PATENT DOCUMENTS

| | | | |
|---|---|---|---|
| 4,087,628 | 5/1978 | Sanders et al. | 455/260 |
| 4,177,430 | 12/1979 | Paul | 455/307 |
| 4,761,829 | 8/1988 | Lynk, Jr. et al. | 455/307 |

FOREIGN PATENT DOCUMENTS 0201423  11/1983  Japan ................................. 455/307

*Primary Examiner*—Curtis Kuntz
*Assistant Examiner*—Timothy H. Keough
*Attorney, Agent, or Firm*—Sughrue, Mion, Zinn, Macpeak & Seas

[57] ABSTRACT

A carrier frequency lock detection circuit receives a baseband signal from a tuning control loop of a receiver. The baseband signal is sent to a comb-filter network which has a plurality of bandpass filters, each receiving a specific sideband frequency. The output power of each filter of the comb-filter network is added up by an adder, filtered by a multiple low-pass filter to reject noise components, and finally converted to a voltage. The thus converted voltage is compared to a preset threshold voltage in order to determine whether the carrier signal has passed through one of the filters of the comb-filter network intended for a sideband, thus indicating that the tuning control loop of the receiver is locked onto a sideband frequency. If such a situation exists, a break-lock indication is sent to the receiver.

6 Claims, 1 Drawing Sheet

CARRIER SIGNAL DETECTION CIRCUIT FEATURING A WIDE RANGE OF SIGNAL/NOISE PERFORMANCE

FIELD OF THE INVENTION

The present invention relates to a carrier frequency detection circuit for use in detecting whether a tuning control loop in a telemetry receiver has locked onto the carrier frequency of a received modulated signal.

BACKGROUND OF THE INVENTION

Normally, narrowband receiver systems have great difficulties in acquiring a desired carrier frequency in the presence of modulation, because of the proximity of the sideband frequencies to the carrier frequency. To facilitate acquisition of the carrier, most receivers scan throughout a specified band in search of the carrier frequency, the only frequency at which the receiver functions properly as a data/information demodulator. However, since the band generally contains many other frequency components which are produced during the modulation process at the transmit end, the receiver may mistake a sideband component for the carrier and lock onto it, resulting in, both, a termination of the carrier acquisition process and a lock to the wrong signal. While manual tuning to acquire the carrier (as opposed to automatic acquisition) may be adequate in some applications, for others it presents major difficulties, including the attention of well-trained personnel and cumbersome spectrum measurement equipment.

Several techniques designed to avoid lock onto undesired sideband signal components during automatic carrier acquisition are in use. Some "anti-sideband" circuits use a method by which the receiver scans through the frequency band, while sampling and storing information on specific spectral frequencies and the corresponding power levels. At the conclusion of the scan, a controller evaluates the stored values to determine the position of the carrier in accordance with characteristics of the spectral signature.

Another technique utilizes internal modulation by which the receiver recovers all detectable signal components. This information is used to modulate the incoming signal with an appropriate phase and level to assure suppression of the sideband components at the output of the circuit.

There are disadvantages associated with the above mentioned conventional carrier acquisition systems. Specifically, some of the anti-sideband methods require a high channel signal-to-noise ratio (S/N), severely limiting the performance when the communications path experiences signal loss due to fading. Other methods are slower in response and require more expensive circuitry. When internal modulation is used, noise components over a wide frequency band are also added during the process, strongly enhancing the overall noise power at the tuning control loop input. This noise substantially reduces the signal-to-noise ratio at the input of the loop, thereby limiting the S/N range over which the carrier may be detected. Furthermore, circuits which scan through the band and then process the data to identify the carrier signal, as described above, are usually awkward in design and require a programmed controller and a storage medium.

SUMMARY OF THE INVENTION

The present invention offers a solution to the above mentioned problems associated with the conventional carrier acquisition circuits described above.

The objective of the present invention is to be able to detect and acquire a carrier signal in a presence of side bands (modulation products), over the smallest possible range of signal-to-noise ratio.

The proposed carrier-detection circuit takes advantage of a priori knowledge of the received signal spectrum. It selectively measures the signal power in the spectral lines by using a pretuned narrow band comb-filter to reject most of the noise components across the frequency band. These filters allow signal detection over a greater range of signal-to-noise ratios. For example, if there are five sideband components, each with a bandwidth of 2 kHz, telemetry receivers that use internal modulation to suppress sideband signals normally require a signal-to-noise ratio on the order of 30 dB for proper anti-sideband discrimination with a loop-bandwidth of 100 Hz. With the new circuit, however, a successful operation can be achieved with a signal-to-noise ratio of only 15 dB, requiring lower carrier power with respect to the background noise (a desirable enhancement for many communication systems). In addition, the technique can be implemented with simple and inexpensive hardware, without a need for computing power and data storage facilities.

The above objects are obtained by taking the output of a conventional telemetry receiver and feeding it through a comb-filter network. The comb-filter network includes a plurality of band-pass filters, each such filter being pretuned to pass the frequencies of an expected sideband line spectral. The comb-filter network also contains down-converter which translate the output signals frequencies to DC. The outputs of the comb-filter networks are added together at a total-power-summation-node, and the output of this summation-node is sent to a multiple low-pass filter, where noise components are rejected. The output of the low-pass filter is then sent to a root-mean-squared converter which translates the total power calculated by the total-power-summation-node to a voltage, which is sent to a detection threshold logic stage. The logic stage compares the voltage output of the root-mean-squared converter to a threshold value, which is manually adjustable and corresponding in value to the power level of the carrier frequency. The result of the comparison is a carrier-detect flag signal, which is used to inform the tuning control loop of the receiver whether or not to maintain its present lock condition.

BRIEF DESCRIPTION OF THE DRAWING

The following is a detailed description of the invention presented in reference to the diagram in the attached figure.

DETAILED DESCRIPTION OF THE PREFERRED EMBODIMENT

Figure 1:
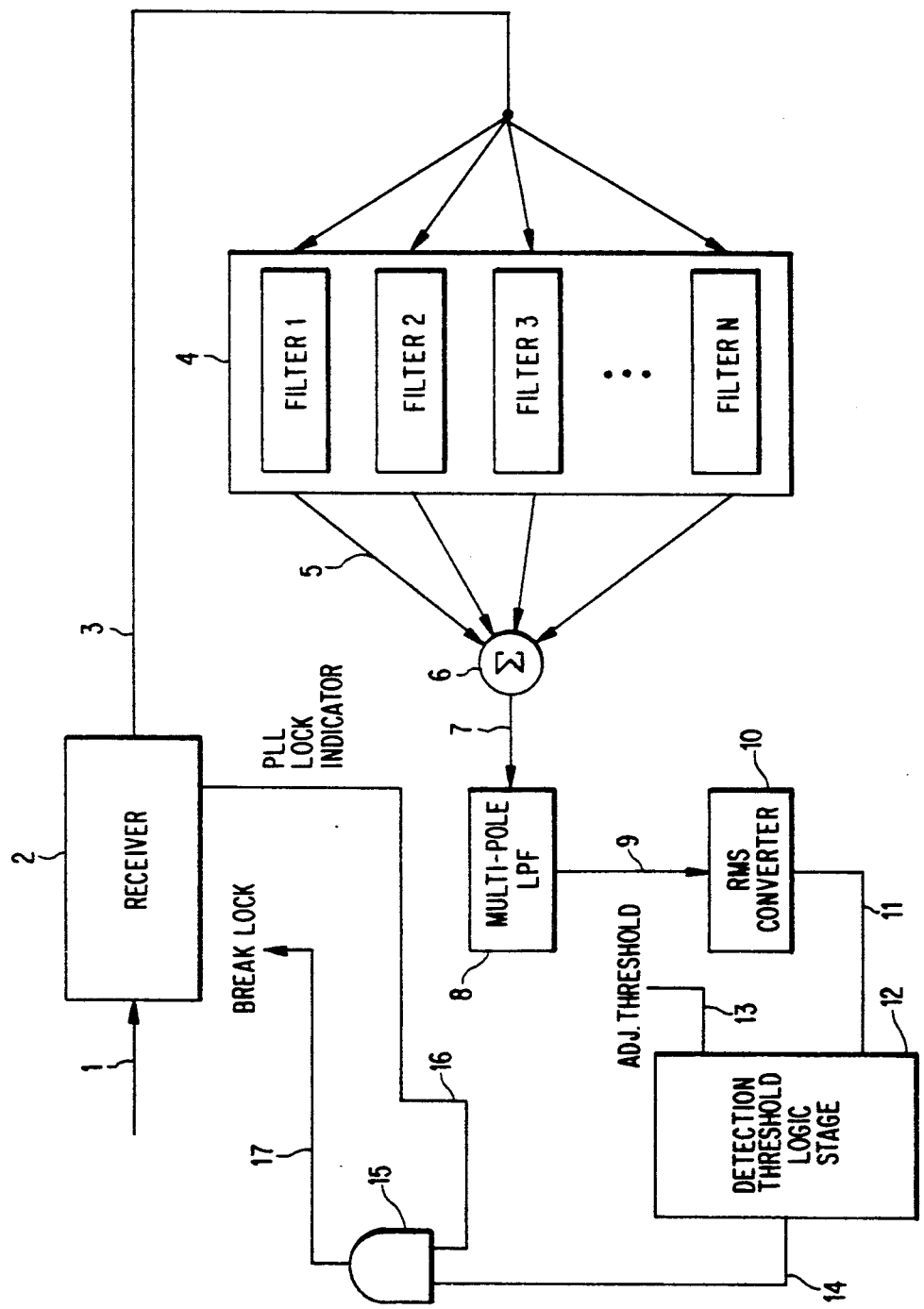
FIG. 1 shows the circuit block diagram of the carrier signal detection circuit of the present invention.

The carrier detection circuit can be applied in carrier recovery systems such as those employed by telemetry receivers. Transmission of telemetry information is achieved by modulating a carrier frequency ($f_c$) with subcarrier signals ($f_{sc}$), onto which some type of telemetry data ($f_d$) is applied. This modulation process produces a complex signal spectrum which contains sidebands as well as carrier frequency components:

$$f_c \pm mf_{sc} \pm nf_d$$

where m and n are integers. The spectral line components other than $f_c$ comprise the undesired sideband signals.

For a given frequency-modulation or phase-modulation index, the positions of the sideband spectral components are fixed across the frequency band with respect to the carrier frequency. The respective power levels depend on the type of modulation and the modulation index. In the case of phase modulation, for example, a modulation index of less than about 1.3 radians guarantees a spectral power distribution such that the carrier power is always greater than the power contained in all the sideband components combined.

The described carrier detection circuit is designed for modulation schemes, in which the carrier signal power is greater than the net power in the sideband signals. In fact, the circuit makes use of the power level differences between the carrier and sideband components. It measures the power of the various signal components as detected by the receiver, and decides as to whether the locked signal is indeed the desired carrier.

Since the baseband signal (BBS), which is generated by a telemetry receiver detector circuit, contains all the information necessary to distinguish between the amplitudes and spectral positions of the various frequency components, it is used as the prime input signal to drive the new anti-sideband circuit. By further processing the BBS signal, the new circuit is able to determine whether the tuning control loop of the telemetry receiver is locked onto the desired carrier signal.

The tuning control loop of the receiver could be either a phase-lock-loop (PLL) or an automatic-frequency-control-loop (AFC). However, for purposes of illustration, the following discussion will involve a phase-lock-loop (PLL).

The description of the carrier detection circuit of the present invention will now be set forth in accordance with FIG. 1.

In FIG. 1, receiver 2 receives signals from an input along line 1. Receiver 2 can be a conventional telemetry-type receiver, which includes a phase-lock-loop (or an automatic frequency control) circuit as well as a coherent automatic gain control circuit, as is well known in the art.

The output of receiver 2, along line 3, feeds a comb-filter network 4 comprised of N band-pass filters. The filters have bandwidths which are pretuned and centered at the frequencies of the expected sideband signals, which are contained in the modulated signal received by the receiver 2. In frequency-modulated or phase-modulated signals, of the type intended to be received by most telemetry receivers, sideband information is concentrated at specific frequency locations along the frequency spectrum of the received signal. The location of the sideband signals are known in advance, (i.e., a priori). Each of the filters in the comb-filter network 4 is set to receive a specific frequency band of the received signal, which is related to the modulated data bandwidth ($f_d$). The comb-filter network 4 also down-converts the output of each filter to a frequency centered at DC (0 Hz).

The down-converted output signals of the filters in the comb-filter network 4 are sent on lines 5 to a total-power-summation node 6, which computes the total power detected by all of the N filters in the comb-filter network 4. The total power is then sent along line 7 to a multiple low-pass filter 8 which further rejects noise components contained in the total-power-summation-node output. The cutoff frequency of the multiple low-pass filter 8 is sufficient to pass the widest bandwidth sideband output of the receiver 2, (i.e., $\pm f_d$).

The sharp filtering by the multiple low-pass filter 8 enables a larger detection/processing range.

The multiple low-pass filter 8 generates a filtered signal (on line 9) to a root-mean-squared (RMS) converter 10, which converts signal power level to voltage.

The output of the RMS circuit on line 11 is then sent to a detection-threshold-logic stage 12. An adjusted signal level along line 13 is also connected to the detection-threshold-logic circuit. The detection-threshold-logic stage 12 is a comparator which compares the magnitudes of the voltage output from the RMS-converter 10 with the adjustable-threshold level.

The adjustable-threshold on line 13 is manually preset to a value which corresponds to a level which is somewhat below the expected power level of the carrier signal to be received by the receiver 2. For example, if the expected carrier frequency power level is 8-milliwatts, the adjustable threshold is set to, for example, 7.3-milliwatts during circuit calibration.

The result of the comparison conducted by the detection-threshold-logic stage 12 is sent along line 14 to an AND-gate 15, which receives a second input along line 16 from receiver 2. Line 16 contains information indicating whether the phase-lock-loop of receiver 2 is locked. The output of the AND-gate 15, along line 17, is sent back to the receiver to instruct the phase-lock-loop of receiver 2 whether to break lock and to continue searching.

Now that the basic circuit layout has been described, the operation of the circuit will now be discussed.

We first consider a case where receiver 2 receives a frequency modulated signal on line 1 and the phase-lock-loop of receiver 2 locks onto a sideband signal component. The baseband signal output of receiver 2 along line 3 is sent to comb-filter network 4, where the respective power levels of each of the expected spectral line frequencies are measured.

The positions of the band-pass filters in the comb-filter network 4 are chosen so that when the phase-lock-loop of receiver 2 is locked onto the carrier frequency, each filter in the network 4 passes an individual subcarrier ($f_{sc}$) including the associated sidebands within a bandwidth of $\pm f_d$.

The inventive circuit determines whether the phase-lock-loop of the receiver 2 is locked onto the carrier signal frequency or one of the sideband frequencies, by measuring the power at the expected sideband frequencies using the comb-filter network 4. The outputs of the comb-filter, having been down-converted to DC by the comb-filter network 4 as explained previously, is input to the total-power-summation 6, where the outputs' powers are added up. The total power level is sent along line 7 to the multiple low-pass filter 8 (described above), which rejects the noise lying outside of the sideband bandwidth. The thus-filtered signal is sent along line 9 to the root-mean-squared converter 10, which converts the power level on line 9 into a voltage value, and sends the voltage along line 11 to the detection-threshold-logic stage 12. At this stage the total power contained in the sidebands is compared to an adjustable-threshold 13, as described previously.

When the phase-lock-loop of receiver 2 is locked onto one of the sideband frequencies, the carrier frequency will be detected by one of the N filters of the comb-filter network 4, and thus, the total power summed at the total-power-summation node 6 will be considerably high. This total power level is sent through the multipole low-pass filter 8, where noise components are rejected, and on through the root-mean-squared converter 10, where the power level is converted into a voltage value. The voltage value is then sent to the detection threshold-logic stage 12 where it is compared in magnitude to the adjustable threshold 13. When the large signal level on line 11 (due to the fact that one of the filters N has passed the carrier signal power) is compared in the detection- threshold-logic stage against, the adjustable threshold (on line 13), which is preset to be less than the voltage corresponding to the power of the expected carrier signal, the detection-threshold-logic stage 12 determines that the voltage on line 11 represents a situation wherein not only the sidebands are detected, but also that the carrier is passed through the comb-filter network 4. As a result, the circuit indicates that an undesired lock condition has been reached. In this case, the signal on line 11 is greater than the signal on line 13.

As a result, an output signal 14 of the detection-threshold-logic stage 12 is sent to the AND-gate 15 as a HIGH signal to indicate that the carrier has been detected by one of the filters of the comb-filter network 4, suggesting that the phase-lock-loop of receiver 2 has locked onto a sideband signal instead of the desired carrier frequency. At the same time, the phase-lock-loop of the receiver sends a lock indication signal along line 16 to the AND gate 15. This takes place whenever the phase-lock-loop is locked onto any signal, be it carrier or sidebands. Since in the presently described case a HIGH signal is sent along line 16 to the AND-gate 15, and a HIGH signal is also sent on line 14 to the AND-gate 15, a HIGH signal is generated by the AND-logic on line 17 to instruct the phase-lock-loop of receiver 2 to break lock and to continue frequency searching.

This process is repeated until the phase-lock-loop (PLL) of receiver 2 eventually locks onto the carrier signal. When the PLL circuit finally locks onto the desired carrier signal, the filters of the comb-filter network 4 pass only the power of the sideband signals since they are perfectly aligned with the corresponding subcarriers' spectral lines. Thus, when the outputs of the filters are summed at the total-power-summation node 6 and sent through the multiple low-pass filter 8 and the RMS-converter 10, the voltage on line 11 becomes smaller than threshold 13. As a result, output 14 of the detection-threshold-logic stage 12 turns LOW, and as previously explained, the PLL of receiver 2 sends a lock indication signal (HIGH logic) on line 16 to the AND-gate 15 (due to the fact that the PLL circuit obtained lock condition.) However, since line 14 is LOW, the output of the AND-gate 15 on line 17 is forced to LOW, and no break-lock command is issued to the receiver from the inventive carrier frequency lock detection circuit. Therefore, the PLL of receiver 2 remains locked onto the carrier signal frequency, as intended.

The ability of the proposed circuit to operate over an extended range of signal-to-noise ratios is largely a result of the narrowband detection of the spectral lines by means of the comb-filter network 4, and the multiple low-pass filter 8. By allowing the passage of minimal noise through the multiple low-pass filter 8, the noise power detected by the RMS-converter 10 has a smaller impact on the overall measured signal level. Consequently, smaller sideband and carrier signals are detectable by the converter, thus yielding a large range of signal-to-noise level operation.

What is claimed is:

1. A carrier frequency lock detection apparatus for detecting whether a tuning control loop of a receiver, which arbitrarily locks onto a frequency of a received modulated signal, has locked onto a carrier frequency of said received modulated signal, said apparatus comprising:

comb-filter means including a plurality of bandpass filters, each bandpass filter being preset so as to pass an expected sideband bandwidth of said received modulated signal, for detecting the power level of said received modulated signal at each expected sideband bandwidth;

addition means for summing the power levels output from said comb-filter means to create a summation power level; and comparator means for comparing a signal corresponding to said summation power level to a threshold power level, which is preset to be less than an expected power level of said carrier frequency of said received modulated signal, to determine whether said tuning control loop of said receiver is locked onto said carrier frequency.

2. A carrier frequency lock detection apparatus as claimed in claim 1 wherein said apparatus further comprises multiple low-pass filter means for receiving said summation power level, and for sending the filtered summation power level to said comparator means.

3. A carrier frequency lock detection apparatus as claimed in claim 1, wherein said apparatus further comprises a converter for receiving said summation power level, for converting said summation power level into a voltage level and for sending the converted summation power level to said comparator means.

4. An apparatus according to claim 1 wherein said apparatus further includes logic means for receiving an output from said comparator means and for instructing said tuning control loop to break lock when the output of said comparator means indicates that said tuning control loop is not locked onto the carrier frequency.

5. A method of detecting whether a tuning control loop of a receiver, which arbitrarily locks onto a frequency of a received modulated signal, has locked onto a carrier frequency of said received modulated signal, said method comprising steps of:

(a) detecting the power levels of said received modulated signal at expected sidebands frequency bandwidths, by using a comb-filter having a plurality of bandpass filters, each bandpass filter being preset so as to pass an expected sideband bandwidth of said received modulated signal;

(b) adding the power levels of said step (a) to produce a summation power level; and (c) comparing said summation power level of said step (b) to a threshold power level, which is preset to be less than an expected power level of said carrier frequency of said received modulated signal, to determine whether said tuning control loop of said receiver is locked onto said carrier frequency.

6. A method according to claim 5 wherein said step (c) involves instructing said tuning control loop to break lock when it is determined that said tuning control loop has not locked onto said carrier frequency.

* * * * *